(12) United States Patent
Wang et al.

(10) Patent No.: US 6,365,924 B1
(45) Date of Patent: Apr. 2, 2002

(54) DUAL DIRECTION OVER-VOLTAGE AND OVER-CURRENT IC PROTECTION DEVICE AND ITS CELL STRUCTURE

(75) Inventors: Albert Z. H. Wang, Santa Clara; Chen H. Tsay, San Jose; Peter Deane, Los Altos, all of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/100,384

(22) Filed: Jun. 19, 1998

(51) Int. Cl.[7] .................. H01L 29/74; H01L 31/111; H01L 23/62
(52) U.S. Cl. .................. 257/110; 257/355; 257/362
(58) Field of Search .................. 257/355, 109, 257/110, 119, 126, 132, 122, 152, 356, 357, 358, 360, 361, 362, 363, 371; 327/313, 314, 325, 328

(56) References Cited

U.S. PATENT DOCUMENTS

| | | | | |
|---|---|---|---|---|
| 3,140,963 A | * | 7/1964 | Svedberg et al. | 148/33.5 |
| 3,427,512 A | * | 2/1969 | Mapother | 257/162 |
| 3,890,543 A | * | 6/1975 | Jonassen | 361/51 |
| 4,109,274 A | * | 8/1978 | Belenkov et al. | 257/110 |
| 4,581,626 A | * | 4/1986 | Krishna et al. | 257/164 |
| 4,967,256 A | * | 10/1990 | Pathak et al. | 257/112 |
| 5,140,401 A | | 8/1992 | Ker et al. | 257/357 |
| 5,400,202 A | | 3/1995 | Metz et al. | 361/56 |
| 5,430,595 A | | 7/1995 | Wagner et al. | 361/56 |
| 5,455,436 A | | 10/1995 | Cheng | 257/356 |
| 5,465,189 A | | 11/1995 | Polgreen et al. | 361/58 |
| 5,561,577 A | | 10/1996 | Motley | 361/56 |
| 5,572,394 A | | 11/1996 | Ker et al. | 361/56 |
| 5,574,618 A | | 11/1996 | Croft | 361/212 |
| 5,576,557 A | | 11/1996 | Ker et al. | 257/173 |
| 5,576,570 A | * | 11/1996 | Ohsawa et al. | 257/369 |
| 5,600,525 A | | 2/1997 | Avery | 361/56 |
| 5,602,404 A | | 2/1997 | Chen et al. | 257/112 |
| 5,793,066 A | * | 8/1998 | Ajit | 257/152 |
| 5,808,326 A | * | 9/1998 | Bernier et al. | 257/109 |
| 5,844,280 A | * | 12/1998 | Kim | 257/355 |

* cited by examiner

*Primary Examiner*—Tom Thomas
*Assistant Examiner*—Shouxiang Hu
(74) *Attorney, Agent, or Firm*—Skjerven Morrill MacPherson LLP; Edward C. Kwok, Esq.

(57) ABSTRACT

A two terminal ESD protection structure formed by an alternating arrangement of adjacent p-n-p-n-p semiconductor regions provides protection against both positive and negative ESD pulses. When an ESD pulse appears across the two terminals of the ESD protection structure, one of the inherent n-p-n-p thyristors is triggered into a snap-back mode thereby to form a low impedance path to discharge the ESD current.

Some embodiments of the ESD protection structure of the present invention have an enhanced current handling capability and are formed by combining a number of standard cells. The standard cells include a corner cell, a center cell and an edge cell which are arranged adjacent each other to form an ESD protection structure which provides for current flow from across many locations therein.

Some embodiments of the ESD protection structure of the present invention include a network consisting of a pair of current sources, e.g. back-to-back zener diodes, each connected in series with a resistor to control the trigger voltage of the ESD protection structure.

3 Claims, 12 Drawing Sheets

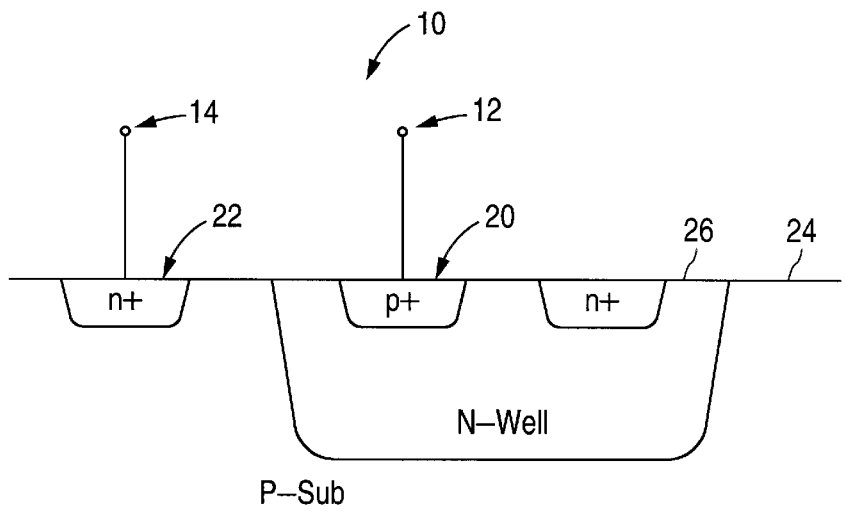
Fig. 1A
(PRIOR ART)
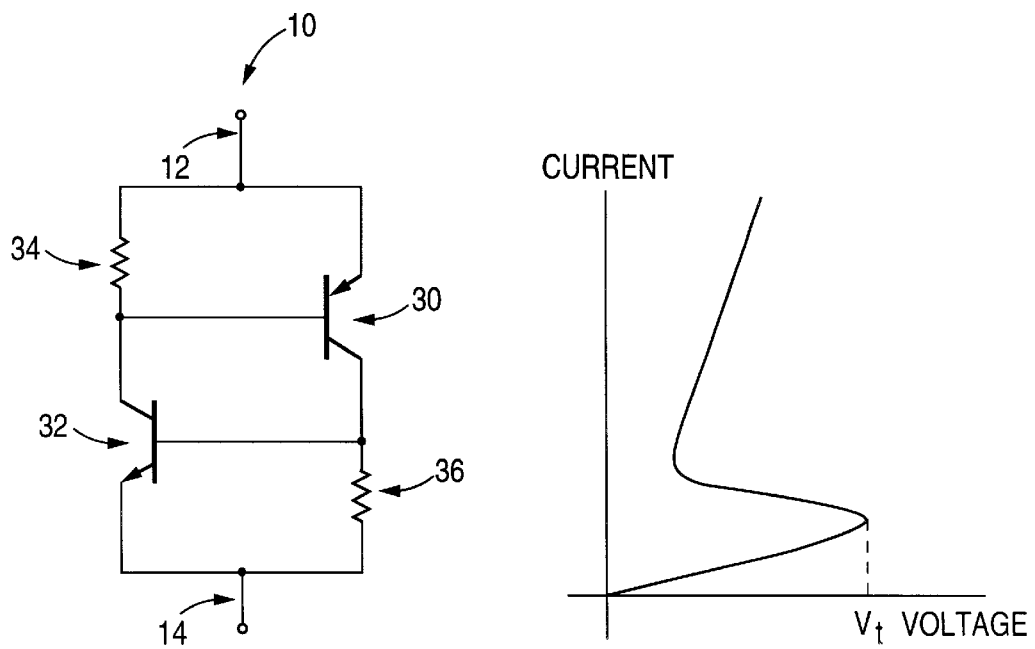
Fig. 1B
(PRIOR ART)
Fig. 1C
(PRIOR ART)

DUAL DIRECTION OVER-VOLTAGE AND OVER-CURRENT IC PROTECTION DEVICE AND ITS CELL STRUCTURE

BACKGROUND OF THE INVENTION

The present invention relates to an electrostatic discharge protection structure.

It is well known that semiconductor Integrated Circuits (IC) may be damaged by Electro-Static Discharge (ESD). Four different causes are identified to be responsible for the ESD phenomenon. The first cause, due to the human-body, results from electrostatic stress exerted on an IC when a human carrying electrostatic charges touches the lead pins of the IC. The second cause, due to handling by a machine, results from electrostatic discharge that occurs when a machine carrying electrostatic charges comes into contact with the lead pins of an IC. The third cause, due to charged devices, results from the ESD current spike generated when an IC lead pins carrying electrostatic charges are grounded during the handling of the IC. The fourth cause, due to induced electric fields, results from the electric field that an IC is exposed to which may produce an ESD in the IC when the IC is later grounded.

Efforts directed at scaling down CMOS processing technologies in order to produce ICs containing transistors with thinner gate oxides and ever decreasing channel dimensions must go hand in hand with development of new structures to protect the ICs against ESD. Therefore, the need continues to exist to reliably protect deep submicron CMOS ICs from the potential damages of ESD.

A well known structure for protecting an IC against ESD damage is a Semiconductor Controlled Rectifier (SCR), also known as a thyristor. FIG. 1A shows a cross-sectional view of a typical lateral SCR 10 which has an anode terminal 12 and a cathode terminal 14. FIG. 1B shows a circuit schematic representation of SCR 10. As is seen from FIG. 1B, SCR 10 is composed of an npn bipolar transistor 32, a pnp bipolar transistor 30 and two parasitic resistors 34 and 36. In order to turn on SCR 10, a positive voltage must be applied between anode terminal 12 and cathode terminal 14 to forward bias both transistors 30 and 32. When SCR 10 turns on, a low impedance discharge path forms between the two terminals of SCR 10 to discharge the current.

FIG. 1C shows the current-voltage characteristic of SCR 10. In FIG. 1C, the vertical axis represents the current flow between terminals 12 and 14, and the horizontal axis represents the voltage across terminals 12 and 14 of SCR 10. The voltage at which SCR 10 enters the region characterized by a negative current-voltage relationship is called the snap-back or the trigger voltage, which is shown in FIG. 1C as $V_t$.

A major disadvantage of SCR 10 is that it provides protection against ESD in only one direction, i.e. either against a positive voltage/current pulse or against a negative voltage/current pulse. Consequently, to protect an IC against ESD, one SCR must be disposed between each input/output pad of the IC and the positive supply voltage and one SCR must be disposed between each input/output pad and the negative supply voltage. Alternatively, an IC is protected against ESD damage by a SCR which provides an active discharge path in one supply direction (positive or negative) and which provides a discharge path through parasitic diodes in the other supply direction. Therefore, what is needed is a single ESD protection structure capable of protecting an IC against both positive and negatives ESD pulses.

FIG. 1D shows a top view of SCR 10 constructed using conventional layout techniques. The rectangular shape of $p^+$ region 20 or $n^+$ region 22 is known in the art as a finger structure. When an ESD pulse appears across anode terminal 12 and cathode terminal 14, current enters into or departs from $p^+$ region 20 and $n^+$ regions 22 from across only a single edge of each of the fingers, designated in FIG. 1D with solid arrows 30. In order to increase the current handling capability—hence to improve the ESD performance of SCR 10—prior art layout techniques add more $n^+$ fingers in p-type substrate 24 and more $p^+$ fingers in n-well 26. However, by thus adding more $p^+$ and $n^+$ fingers, a significant amount of semiconductor surface area is occupied without a proportional increase in the ESD performance of the resulting structure. This is because, the current flow between each pair of newly added $p^+$ and $n^+$ fingers is limited to a component crossing only a single edge of each of the added fingers. It is, therefore, advantageous to develop an ESD layout structure which provides for current flow across more edges of the $p^+$ and $n^+$ finger.

Referring to FIG. 1A, the trigger voltage, $V_t$, of SCR 10 depends on the concentration profile of the impurities that form the n-type and the p-type semiconductor regions of SCR 10. Therefore, once SCR 10 is fabricated using a conventional IC fabrication process technology, its trigger voltage cannot be changed.

Often an IC includes several subcircuits which operate at different supply voltages. For example, some blocks of circuitry within an IC may require five volts to operate, while other blocks of circuitry within the same IC may require fifteen volts to operate. Because SCR 10 has a fixed trigger voltage, it is not suitable for use as an ESD protection device in a multi-supply voltage IC. To protect a multi-supply voltage IC against ESD, prior art techniques use different ESD protection structures that trigger at different voltages. It is, therefore, advantageous to have a single ESD structure whose trigger voltage is varied to accommodate for ESD protection at different supply voltages.

SUMMARY OF THE INVENTION

An Electro-Static Discharge (ESD) protection structure, in accordance with the present invention, protects an Integrated Circuit (IC) against both positive and negative ESD pulses.

The ESD protection structure has an anode terminal and a cathode terminal and is composed of five semiconductor regions to form an n-p-n-p-n device. The ESD structure, hence, includes one pnp bipolar transistor, two npn bipolar transistors and four parasitic resistors.

When the voltage potential of an ESD pulse appearing across the two terminals of the ESD protection structure exceeds the reverse breakdown voltage of the collector-base junction of the pnp transistor, electron-hole pairs are generated. The holes thus generated flow toward the cathode terminal, forcing the npn transistor whose emitter region is connected to the cathode terminal to turn on. Subsequently, the ESD protection structure enters into a snap-back mode, thereby, to form a low impedance current discharge path between the two terminals to discharge the ESD current. The trigger voltage of the ESD protection structure of the present invention is hence determined by the reverse-breakdown voltage of the collector-base junction of the pnp transistor.

Some embodiments of the ESD protection structure of the present invention are formed by combining a number of standard cells, in accordance with the present invention. The standard cells which include a center cell, an edge cell and a corner cell are arranged adjacent each other in a particular fashion to form a square-shaped n-p-n-p-n ESD protection structure which provides a low impedance current discharge path from many locations therein. Accordingly, the square-shaped ESD protection structure thus formed has an enhanced current handling capability. Advantageously, the number of standard cells used to construct a square-shaped ESD protection structure may be varied at will to increase or decrease the amount of the current that is discharged.

Some embodiments of the present invention have a variable trigger voltage. To achieve trigger voltage variability, the base terminal of each of the npn transistors is coupled to a network consisting of a pair of back-to-back zener diodes connected in series with a resistor. Depending on the polarity of the applied ESD pulse, one of the zener diode pairs turns on thereby to generate current to the resistor connected thereto. The voltage developed across the resistor raises the base-emitter voltage of the npn transistor coupled thereto, thereby triggering the ESD protection structure.

BRIEF DESCRIPTION OF THE DRAWINGS

FIG. 1A shows a cross-sectional view of a lateral SCR device as known in the prior art.

FIG. 1B shows a circuit schematic view of the lateral SCR device of FIG. 1A.

FIG. 1C shows the current-voltage characteristic of the lateral SCR device of FIG. 1A.

DETAILED DESCRIPTION OF THE INVENTION

Figure 1D:
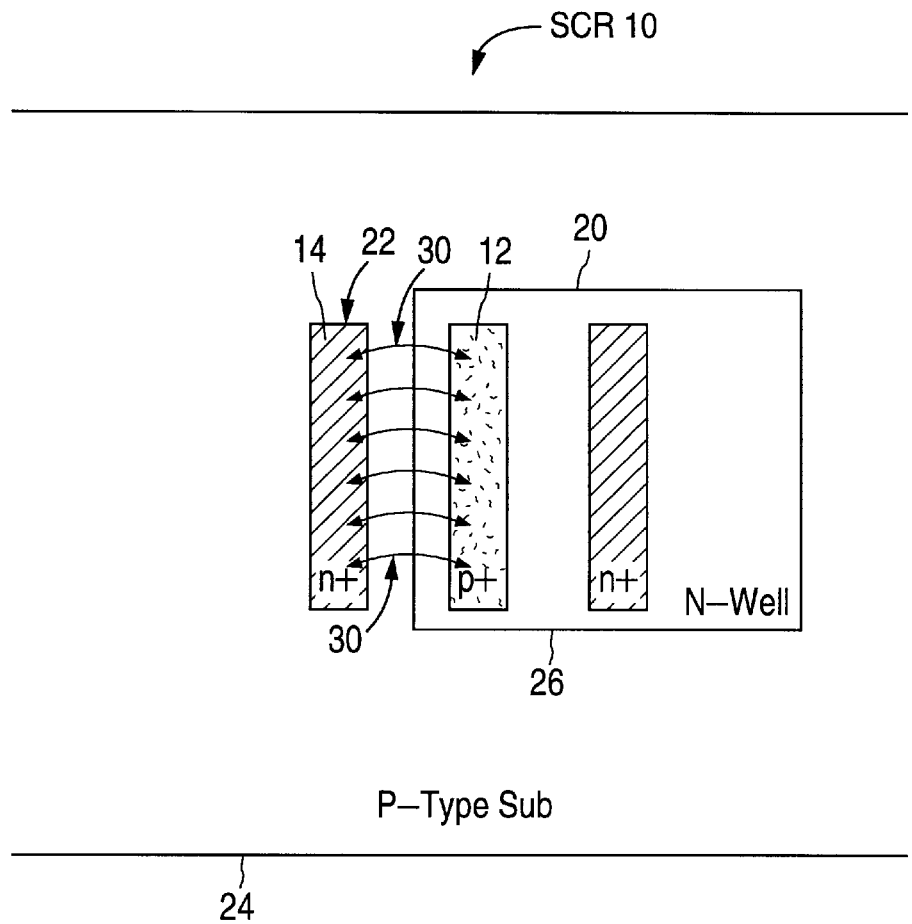
FIG. 1D shows a top view of the lateral SCR device of FIG. 1A.
Figure 2:
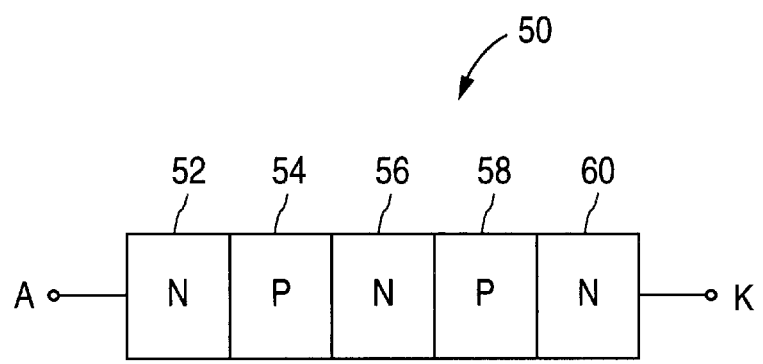
FIG. 2 shows the various semiconductor regions of the two terminal dual-direction ESD protection structure, in accordance with the present invention.

A dual-direction Electro-Static Discharge (ESD) protection structure 50, in accordance with the present invention, is shown in FIG. 2. ESD protection structure 50 is composed of three n-type semiconductor regions 52, 56 and 60 and two p-type semiconductor regions 54 and 58. P-type region 54 is disposed between n-type regions 52 and 56. P-type region 58 is disposed between n-type regions 56 and 60. Consequently, structure 50 is formed by an alternating arrangement of adjacent n-p-n-p-n semiconductor regions. Anode terminal A is in electrical contact with n-type region 52 and cathode terminal K is in electrical contact with n-type region 60.

Figure 3:
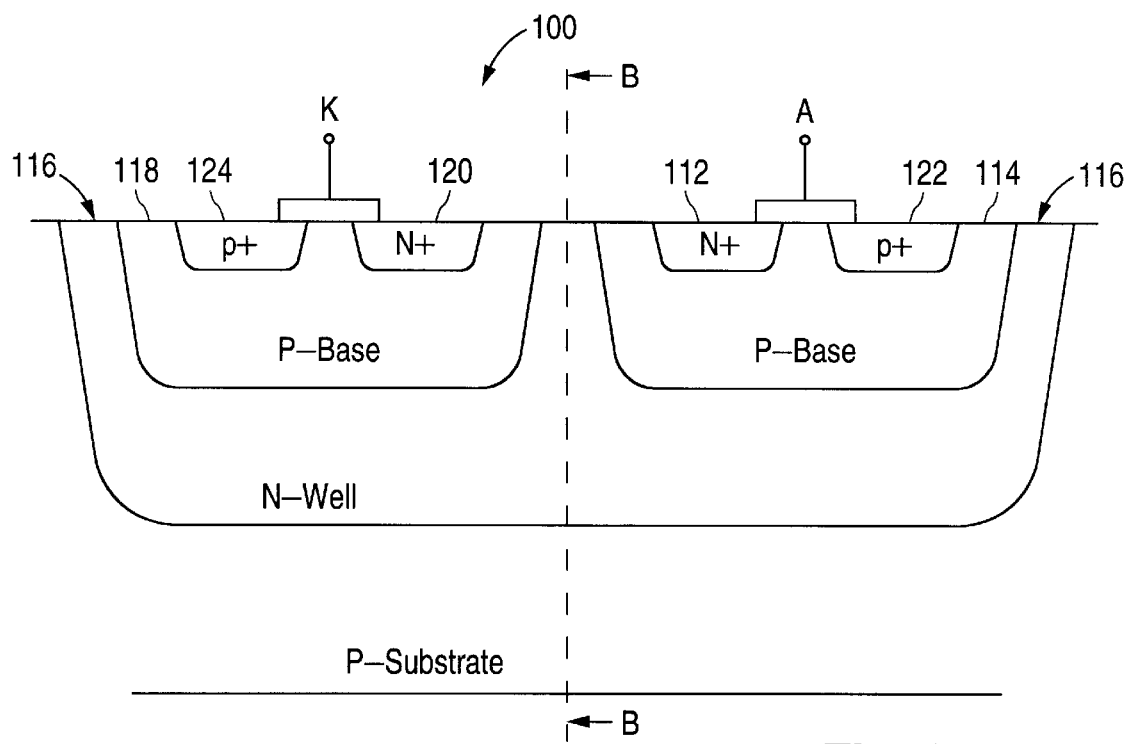
FIG. 3 shows a cross-sectional view of the dual-direction ESD protection structure of the present invention, fabricated in a standard CMOS process technology.

FIG. 3 shows a cross sectional view of ESD protection structure 100 of the present invention, fabricated using a standard CMOS process technology. P-base 114 is disposed between $n^+$ region 112 and n-well 116. Similarly, p-base 118 is disposed between $n^+$ region 120 and n-well 116. Anode terminal A is formed over and is in electrical contact with $n^+$ region 112 and $p^+$ region 122. Cathode terminal K is formed over and is in electrical contact with $n^+$ region 120 and $p^+$ region 124. As is seen from FIG. 3, structure 100 has a symmetrical geometrical construct. Hence, a cut along line BB in FIG. 3 divides structure 100 into two physically indistinguishable parts. Because of this symmetry, ESD protection structure 100 operates without regard to the polarity of an ESD pulse appearing across its two terminals A and K, thereby, rendering the two terminals A and K fully interchangeable. CMOS technology fabrication processing steps required to manufacture embodiment 100 are well known in the art.

Figure 4:
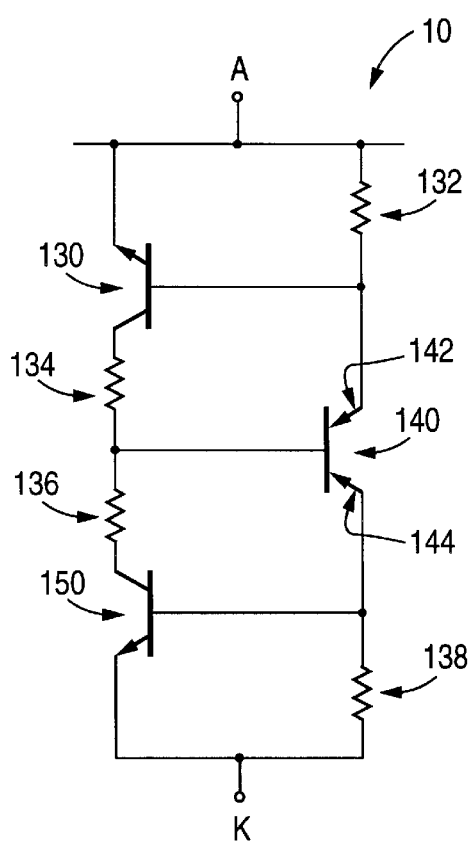
FIG. 4 shows a circuit schematic view of the ESD protection structure of FIG. 3.

FIG. 4 shows a circuit schematic view of embodiment 100 of the present invention. Concurrent referrals to FIGS. 3 and 4 assist the reader in understanding the discussion below. $N^+$ region 112, p-base 114 and n-well 116 of FIG. 3 form the emitter, the base and the collector regions of npn bipolar transistor 130 of FIG. 4, respectively. $N^+$ region 120, p-base 118 and n-well 116 of FIG. 3 form the emitter, the base and the collector regions of npn bipolar transistor 150 of FIG. 4, respectively. N-well 116 forms the base region of pnp bipolar transistor 140.

If a positive voltage or current pulse is applied across terminals A and K of ESD protection structure 100, pnp transistor 140 and npn transistor 150 turn on while npn transistor 130 remains off. Accordingly, p-base 118 forms the collector region of pnp transistor 140 and p-base 114 forms the emitter region of transistor 140, shown in FIG. 4 by solid arrow 142.

If a negative voltage or current pulse is applied across terminals A and K of ESD protection structure 100, pnp transistor 140 and npn transistor 130 turn on while npn transistor 150 remains off. Accordingly p-base 114 forms the collector region of pnp transistor 140 and p-base 118 forms the emitter region of transistor 140, shown in FIG. 4 by hollow arrow 144.

Resistor 132 represents the resistance of the p-base 114 disposed between p+ region 122 and n-well 116. Resistors 134 and 136 represent the resistances of the n-well region 116. Resistor 134 is located across the base region of transistor 140 and the collector region of transistor 130 and resistor 136 is located across the base region of transistor 140 and the collector region of transistor 150. Resistor 138 represents the resistance of the p-base 118 disposed between p+ region 124 and n-well 116.

Figure 5:
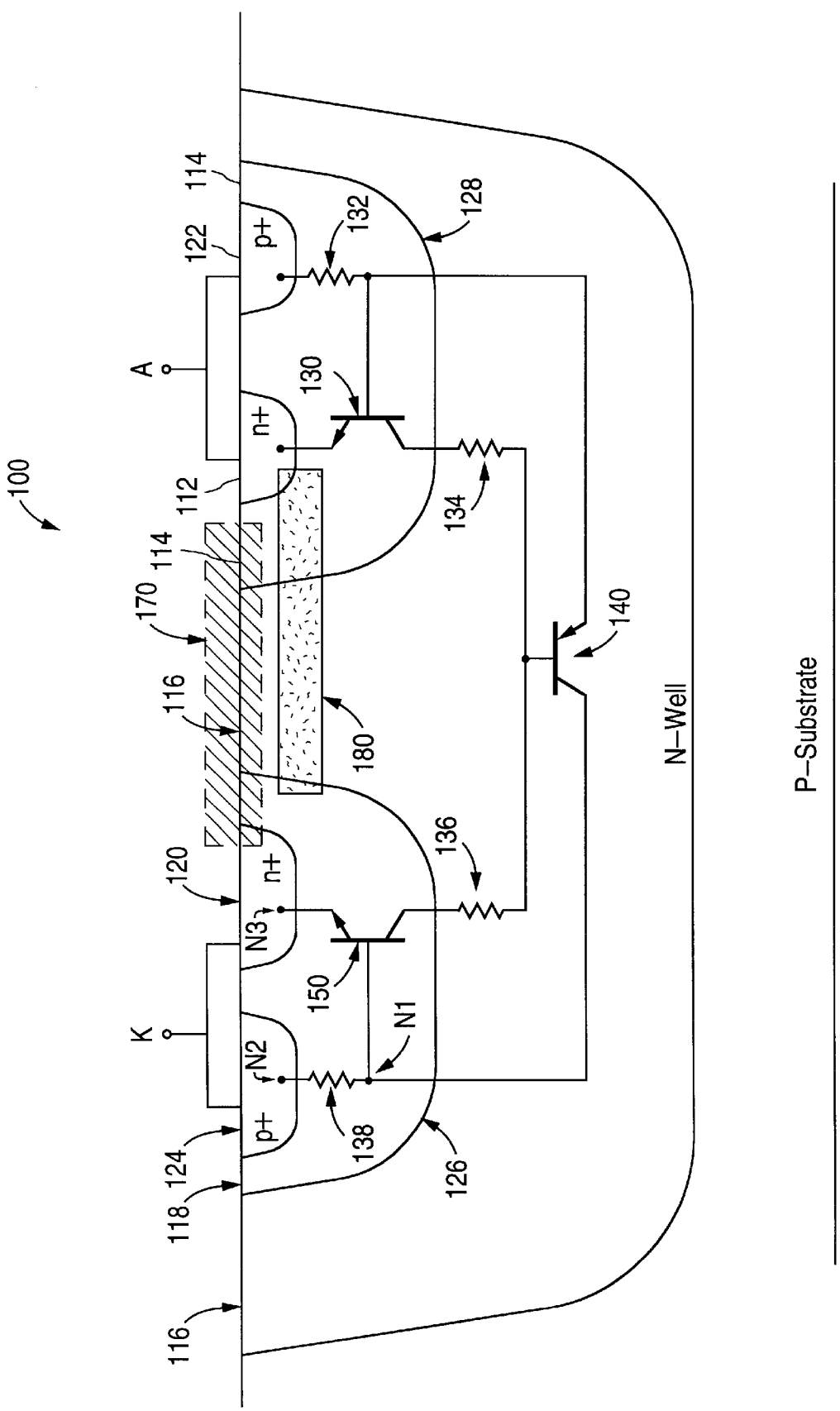
FIG. 5 is a composite of the cross-sectional and the circuit schematic views of FIGS. 3 and 4.

FIG. 5 shows the circuit schematic view of FIG. 4 superimposed on the cross-sectional view of FIG. 3. FIG. 5 assists the reader in understanding the operation of ESD protection structure 100 of the present invention.

Referring to FIG. 5, when a positive pulse is applied across terminals A and K, transistors 140 and 150 turn on. Thereafter thyristor 170, defined by p-n-p-n regions 114, 116, 118 and 120 (only a portion of which is shown in FIG. 5), is triggered into a snap-back mode. Alternatively, when a negative pulse is applied between terminals A and K, transistors 140 and 130 turn on. Subsequently, thyristor 180 defined by p-n-p-n regions 118, 116, 114 and 112 (only a portion of which is shown in FIG. 5), is triggered into a snap-back mode. Only the operation of ESD protection structure 100 during an application of a positive ESD pulse across terminals A and K is discussed. The operation of ESD structure 100 when a negative pulse is applied across terminals A and K can be easily inferred due to ESD protection structure 100's symmetry.

Referring to FIG. 5, when a positive ESD pulse appears across terminals A and K, p-n junction 128 formed between regions 114 and 116 is forward-biased and p-n junction 126 formed between regions 118 and 116 is reverse-biased. When the applied reverse bias across junction 126 exceeds a threshold value, junction 126 enters into a reverse breakdown region thereby generating electron-hole pairs. The holes thus generated accelerate toward p+ region 124 and are collected by terminal K. As the holes drift toward p+ region 124, a voltage potential develops across resistor 138 between nodes N1 and N2. Because p+ region 124 and n+ region 120 are both connected to terminal K, the voltage across nodes N1 and N2 also appears across nods N1 and N3. When the voltage across nodes N1 and N3 exceeds a certain value, the base-to-emitter junction of npn bipolar transistor 150 is forward-biased thereby turning on npn transistor 150.

As is seen from FIG. 5, resistor 136 is connected across the collector region of transistor 150 and the base region of transistor 140. Therefore, as transistor 150 turns on, the collector current of transistor 150, which provides the current to the base region of pnp transistor 140, increases. Subsequently, as the voltage across the base-emitter junction of transistor 140 falls below a certain limit, transistor 140 turns on. Once both transistors 150 and 140 are turned on, thyristor 170 is triggered into a snap-back mode, resulting in the formation of a very low impedance path between terminals A and K to discharge the ESD current, thereby, to protect the IC against the potential damages of the ESD pulse.

Figure 6:
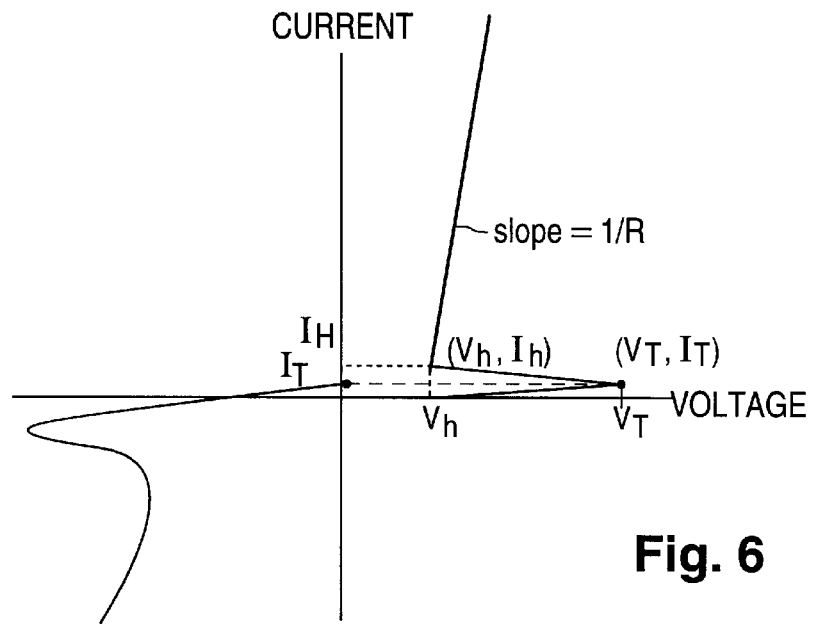
FIG. 6 shows the current-voltage characteristic of the ESD protection structure of the present invention.

FIG. 6. shows the current-voltage (I-V) characteristic of a p-n-p-n thyristor 170 of FIG. 5. As the voltage across the two terminals of thyristor 170 increases, the current flow through thyristor 170 increases until the point marked by the I-V coordinates $(I_t, V_t)$, known in the art as the trigger point, is reached. If the voltage across the two terminals increases beyond the trigger voltage, the thyristor enters into a snap-back mode. Thereafter, a low impedance path between the two terminals is formed requiring a much lower voltage to sustain the current flow. Consequently, the voltage across the p-n-p-n device decreases to a new value $V_h$, commonly known in the art as the holding voltage. The I-V coordinates of the holding point are shown in FIG. 6 as $(I_h, V_h)$. Once the holding voltage is reached, any increase in the voltage across the p-n-p-n device results in a sharp increase in the current through the device. As is seen from FIG. 6, the slope of the I-V characteristic of the device beyond the holding point is very sharp, signifying the high conductance of the device in this deep snap-back region.

The I-V characteristic of the p-n-p-n device between the trigger voltage $V_t$ and the holding voltage $V_h$ has a negative slope, indicating the fact that the device exhibits a negative resistance in this region.

Both the trigger voltage and the holding voltage are important parameters in the operation of a p-n-p-n device. The trigger voltage must be exceeded before the snap-back occurs, and the holding voltage must be exceeded before the device exhibits a very low resistance. In some embodiments of the present invention the resistance exhibited beyond the holding voltage is approximately 1 to 2 ohms.

Referring to FIG. 5, the low impedance current discharge path across terminals A and K of ESD protection structure 100 during an applied positive voltage/current ESD pulse is as follows. The current flows from terminal A, through resistor 132, into the emitter and the collector regions of transistor 140 and, subsequently, into the base region of transistor 150. Thereafter, the current enters the emitter region of transistor 150 and finally exits structure 100 through terminal K.

When a negative voltage/current ESD pulse appears across terminals A and K of ESD protection structure 100, thyristor 180 is triggered into a snap-back region. The resulting low impedance current discharge path formed between terminals A and K is as follows. The ESD current flows from terminal K and after passing through resistor 138, flows into the emitter and the base regions of transistor 140 and, subsequently, enters into the collector region of transistor 130. Thereafter, the current enters into the emitter region of transistor 130 and finally exits structure 100 through terminal A.

Therefore, a single ESD protection structure 100, in accordance with the present invention, advantageously provides protection against both positive and negative ESD pulses.

Figure 7:
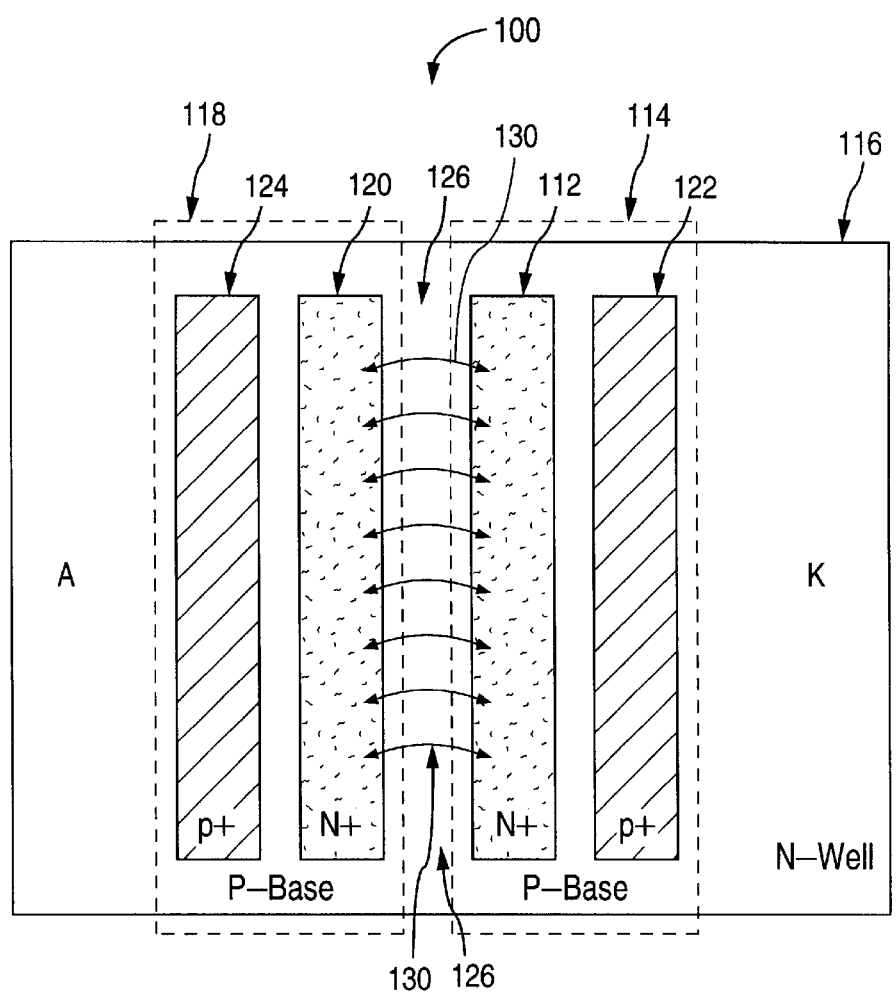
FIG. 7 shows a top view of the dual-direction ESD protection structure of FIG. 3 as well as the path of a current flow between adjacent p-base regions thereof during an ESD pulse.

FIG. 7 shows a top view of the ESD protection structure 100 of the present invention. When an ESD pulse arrives between terminals A and K, current flows between p-base 114 and p-base 118 across section 126 of n-well 116, as shown by solid arrows 130. Therefore, as is seen from FIG. 7, the amount of the current flow is limited to that which crosses only a single edge of each of the p-base regions 114 and 118. In order to increase the amount of current handling capability—hence to increase the ESD protection—prior art techniques add more p-base regions 114 or 118 so as to allow for the addition of more rectangle-shaped p+ and n+ regions, which are commonly referred to in the art as finger structures. The conventional technique of adding more p+ and n+ fingers, gives rise to a significant increase in the amount of the substrate surface area consumed without a proportional increase in the ESD protection of the resulting structure. Therefore, it is important to develop an ESD protection structure which more efficiently utilizes the substrate surface area to provide a current handling capability that is greater than those known in the prior art.

In accordance with the present invention, to increase the current handling capability and hence the degree of ESD protection that a given area of a substrate surface provides, three building block cells, namely a corner cell, a center cell and an edge cell are developed. FIGS. 8A–10A and 8B–10B show the top views and the cross-sectional views of a corner cell 300, a center cell 400 and an edge cell 500, respectively. The top views of the three building block cells have square geometrical shapes with identical areas.

Figure 8A:
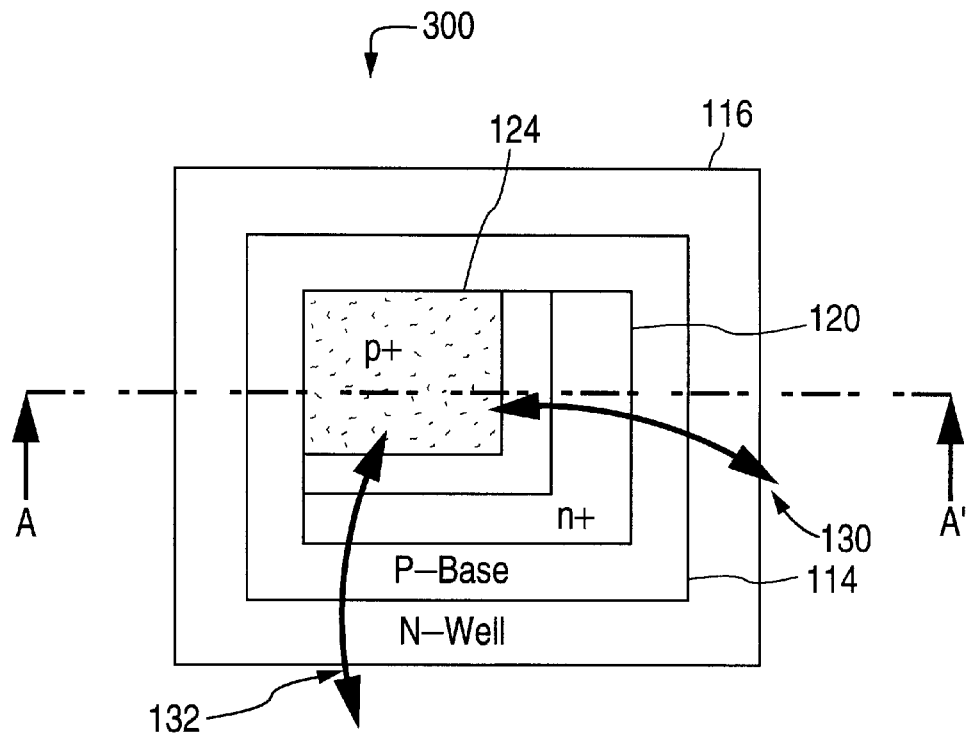
FIG. 8A shows a top view of a corner cell forming the corner regions of a current-enhanced ESD protection structure, in accordance with the present invention.
Figure 8B:
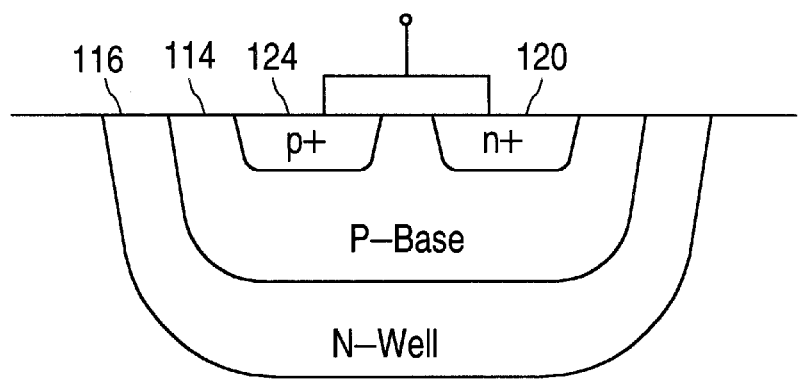
FIG. 8B shows a cross sectional view of the corner cell of FIG. 8A.
Figure 9A:
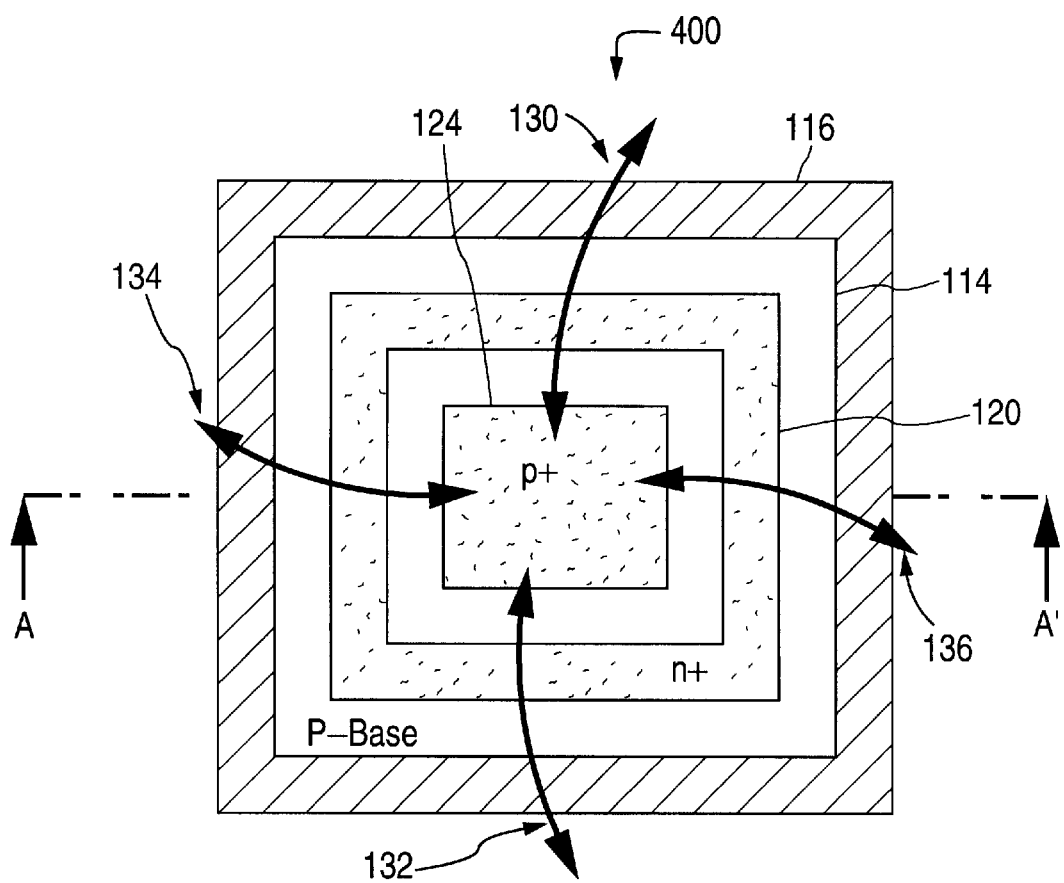
FIG. 9A shows a top view of a center cell forming the center regions of a current-enhanced ESD protection structure, in accordance with the present invention.
Figure 9B:
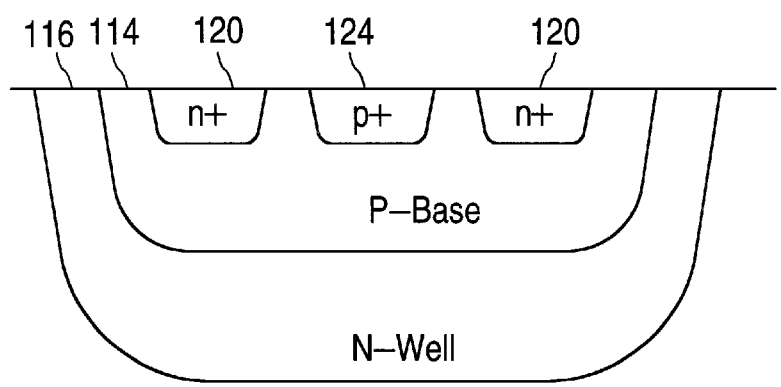
FIG. 9B shows a cross sectional view of the center cell of FIG. 9A.
Figure 10A:
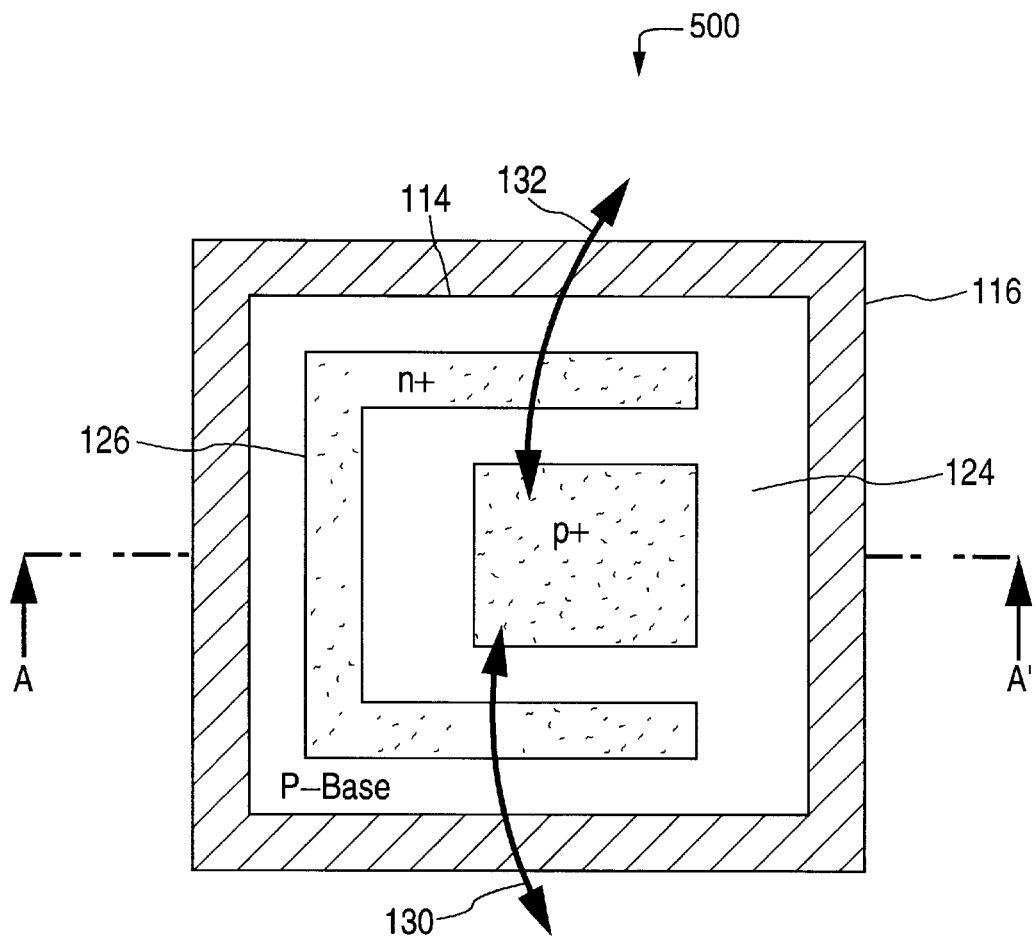
FIG. 10A shows a top view of an edge cell forming the edges of a current-enhanced ESD protection structure, in accordance with the present invention.
Figure 10B:
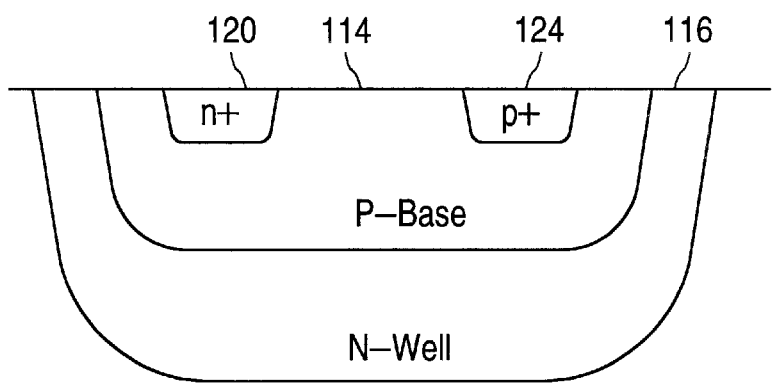
FIG. 10B shows a cross sectional view of the edge cell of FIG. 10A.

From FIG. 8A it is seen that corner cell 300 provides current flow either to or from P$^+$ region 124 along the two directions marked by solid arrows 130 and 132. From FIG. 9A, it is seen that center cell 400 provides current flow either to or from P$^+$ region 124 along the four directions marked by solid arrows 130, 132, 134 and 136. From FIG. 10A it is seen that edge cell 500 provides current flow either to or from P$^+$ region 124 along the two directions marked by solid arrows 130 and 132. As their names imply, corner cell 300, center cell 400 and edge cell 500 are disposed in the corner locations, the center locations and the edge locations of a current-enhanced square-shaped ESD protection structure, in accordance with the present invention.

Figure 11A:
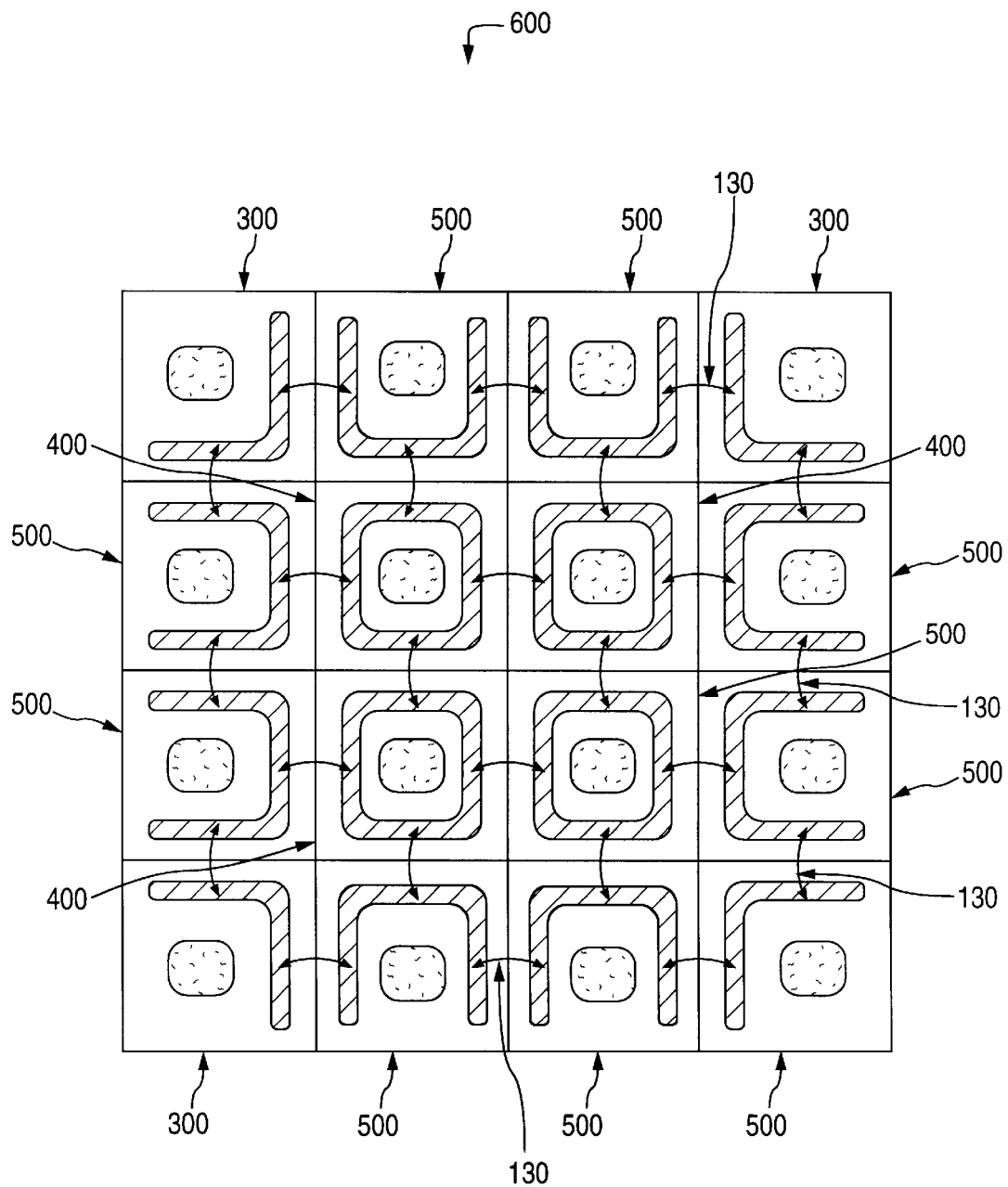
FIG. 11A shows a top view of a first embodiment of a current-enhanced ESD protection structure, in accordance with the present invention, constructed using the corner cell, the center cell and the edge cells of FIGS. 8A, 9A and 10A.

FIG. 11A shows a top view of embodiment 600 of the current-enhanced ESD protection structure of the present invention. Embodiment 600 is composed of four center cells 300, four corner cells 400 and eight edge cells 500. Because of the identical sizes of the cells, embodiment 600 has a square shape. Solid arrows 130 in FIG. 11A designate the junctions across which currents flow during an ESD pulse. As is seen from FIG. 11, depending on the cell types, the current flow between adjacent cells occurs along either two, three or four directions. In contrast, the ESD protection structure of FIG. 7, constructed using conventional layout techniques, provides a current flow between adjacent cells along only one direction. Therefore, ESD protection structure 600 has an enhanced current handling capability and, as such, given identical substrate surface areas, provides a substantially greater degree of ESD protection than does ESD protection structure 100 of FIG. 7.

Figure 11B:
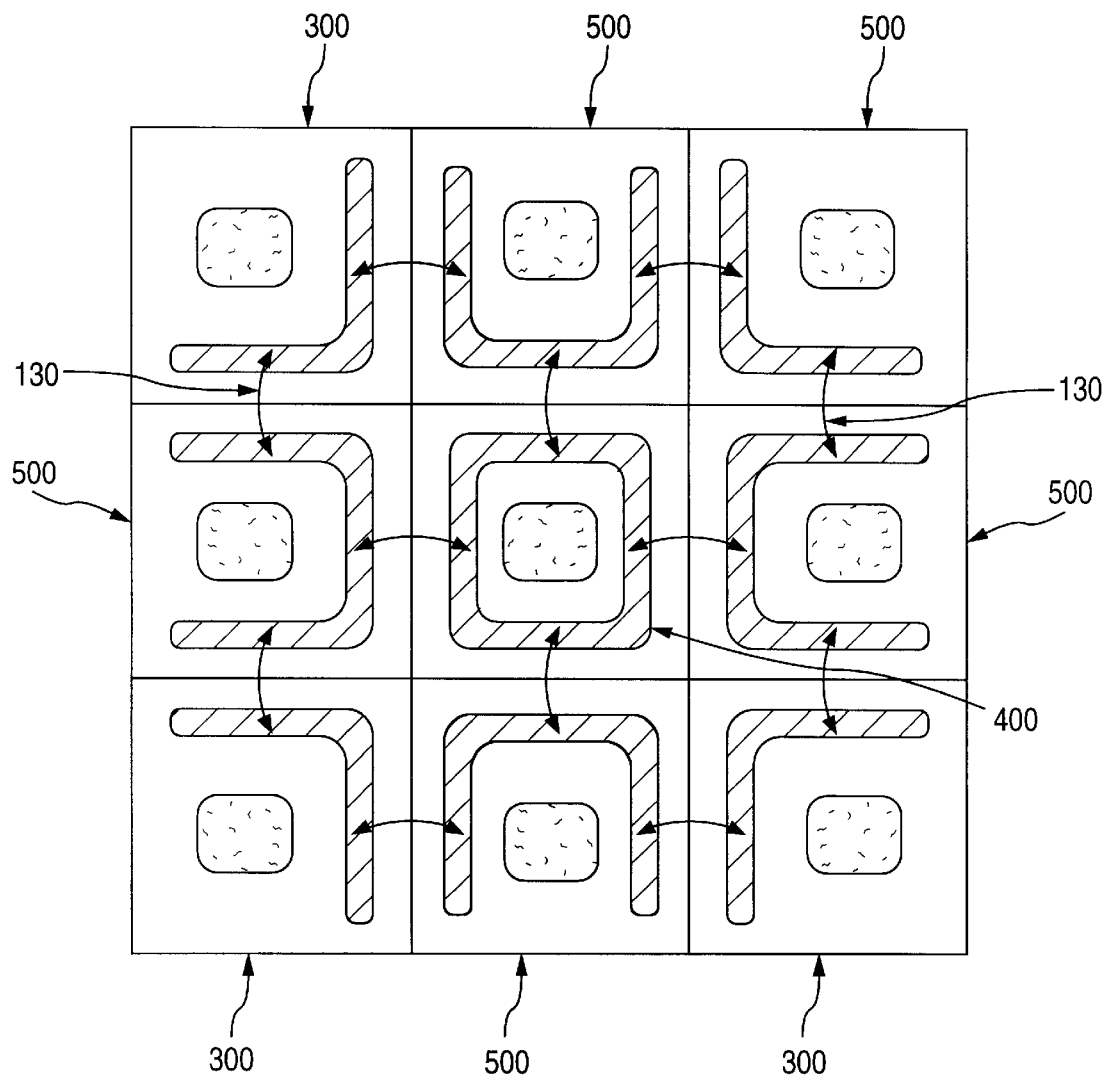
FIG. 11B shows a top view of a second embodiment of a current-enhanced ESD protection structure, constructed using the corner cell, the center cell and the edge cells of FIGS. 8A, 9A and 10A.

Advantageously, because of the square geometrical shapes and the-modular construct of the building block cells, it is possible to vary the degree of ESD protection desired by merely increasing or decreasing the number of such cells used in forming a current-enhanced ESD protection structure. For instance, if a smaller current handling capability and ESD protection is adequate, four corner cells 300, one center cell 400 and four edge cells 600 are used to construct a current enhanced ESD protection structure, as shown in FIG. 11B.

As discussed above, the trigger voltage of ESD protection structure 100 of FIG. 5 is determined by the reverse breakdown voltage of junction 126, which typically varies from 15 to 20 volts. The trigger voltage of structure 100 is varied by changing the concentration and the profile of the impurities in n-well 116 and p-base 118 regions. However, it is often not possible to vary the parameters of a CMOS manufacturing process technology in order to change the trigger voltage of an ESD protection structure formed thereby. Therefore, alternative methods of adjusting the trigger voltage of an ESD protection device is needed.

Figure 12:
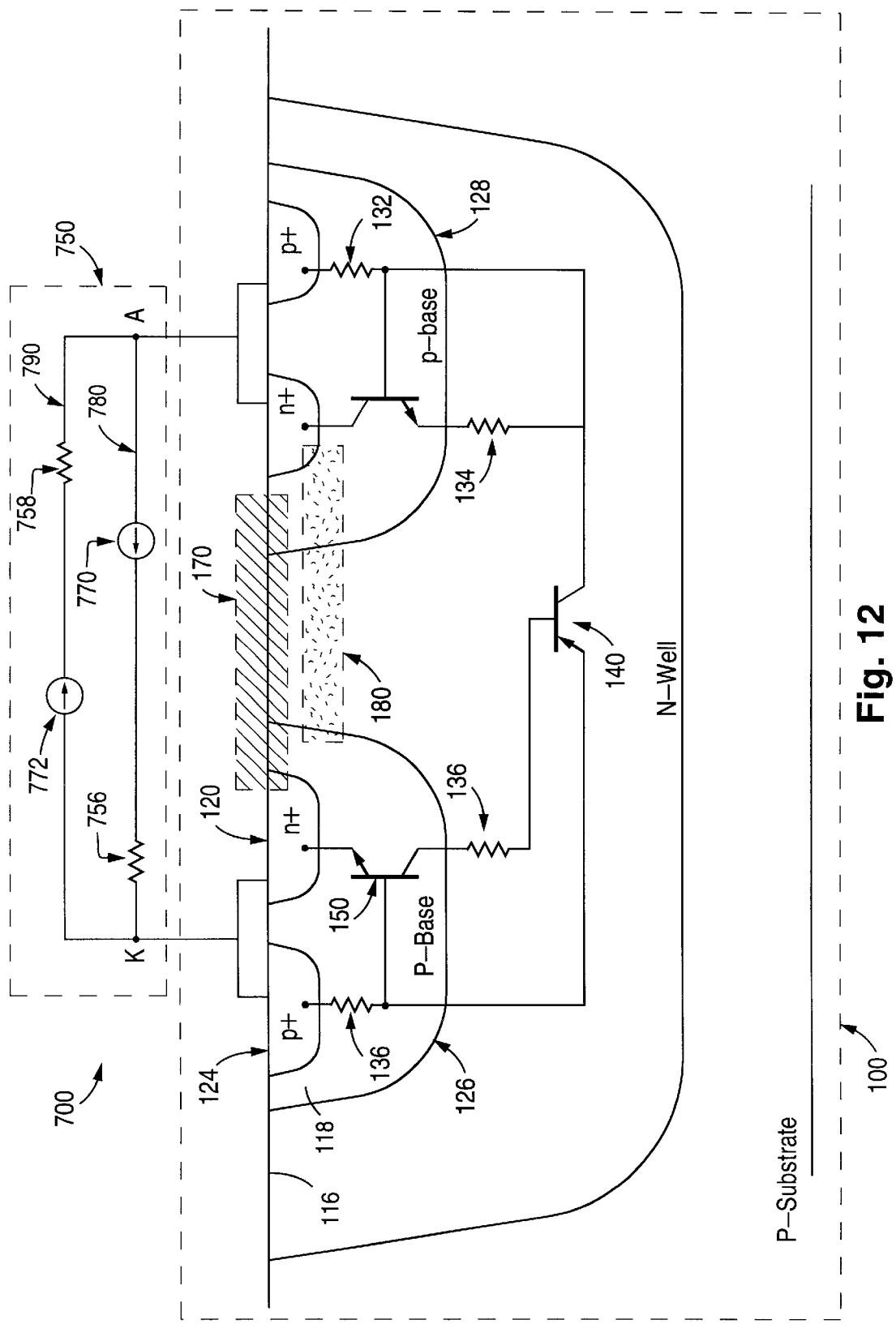
FIG. 12 shows a composite of a cross-sectional view and a circuit schematic view of a first embodiment of a variable trigger voltage ESD protection structure, in accordance with the present invention.

FIG. 12 shows a super-imposition of a cross-sectional view and a circuit schematic view of ESD protection structure 700 of the variable trigger voltage ESD protection structure of the present invention. ESD protection structure 700 is formed by coupling circuit 750 to ESD protection structure 100 of FIG. 5.

Figure 13:
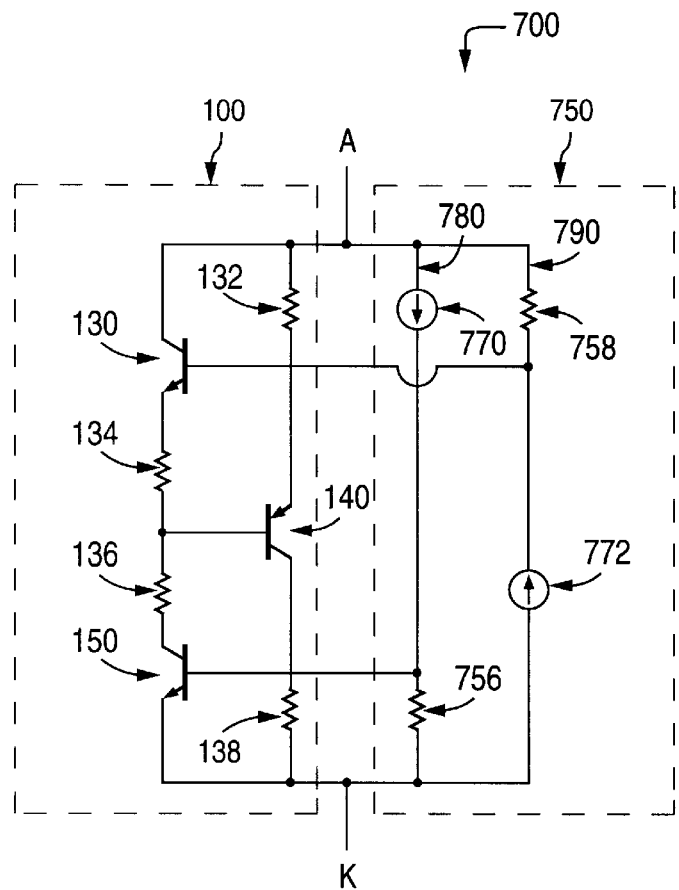
FIG. 13 shows a circuit schematic view of the variable trigger voltage ESD protection structure of FIG. 12.

FIG. 13 shows a circuit schematic view of ESD protection structure 700 of the present invention. As is seen from FIG. 13, circuit 750 includes branches 780 and 790. Branch 780 includes current source 770 and resistor 756, and branch 790 includes current source 772 and resistor 758. Current source 770 is connected across terminal A and the base terminal of transistor 150. Resistor 756 is connected across terminal K and the base terminal of transistor 150. Current source 772 is connected across terminal K and the base terminal of transistor 130. Resistor 758 is connected across terminal A and the base terminal of transistor 130. The operation of embodiment 700 is discussed next and is best understood by referring to FIG. 12.

When a positive voltage/current pulse is applied across terminals A and K, current source 770 is activated and provides current to resistor 756 thereby forward-biasing the base-to-emitter voltage of npn transistor 150 and forcing transistor 150 and, subsequently, transistor 140 to turn on. Thereafter, thyristor 170 is triggered into a snap-back mode thereby to form a low impedance current discharge path between terminals A and K.

By varying the amount of current generated by current sources 770 and 772 as well as by changing the resistances of resistors 756 and 758, the trigger voltage of embodiment 700 is varied. Therefore, ESD protection structure 700 advantageously has a variable trigger voltage.

When a negative pulse is applied between terminals A and K, current source 772 forces transistor 130 to turn on, triggering thyristor 180 into a snap-back mode and thereby forming a low-impedance discharge path between terminals A and K.

Figure 14:
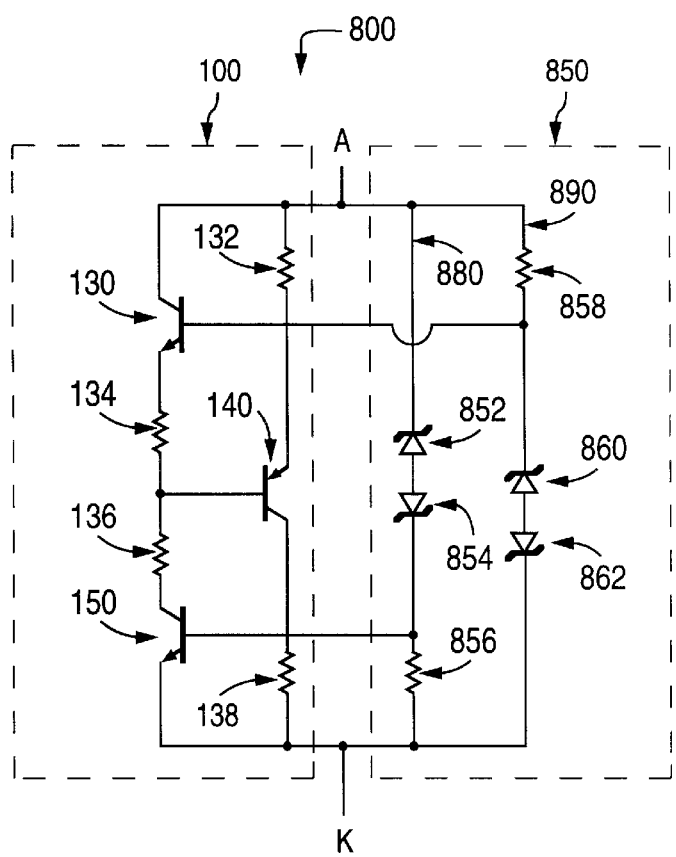
FIG. 14 shows a circuit schematic view of a second embodiment of a variable trigger voltage ESD protection structure of the present invention.

FIG. 14 shows a variable trigger voltage ESD protection structure 800 of the present invention. ESD protection structure 800 is formed by coupling circuit 850 to ESD protection structure 100. In ESD protection structure 800, back-to-back zener diode pair 852 and 854 act as a current source in branch 880 and back-to-back zener diode pair 860 and 862 act as a current source in branch 890. Branch 880 is composed of zener diodes 852 and 854, and resistor 856 which is connected across the base terminal of transistor 150 and the cathode terminal K. Branch 890 is composed of zener diodes 860 and 862, and resistor 858 which is connected across the base terminal of transistor 130 and the anode terminal A. The operation of structure 800 is discussed next.

When a positive voltage/current pulse is applied across terminals A and K, the voltage across diode 852 increases until diode 852 enters a reverse breakdown region to thereby act as a current source. Concurrently, diode 854 is forward biased to provide a voltage drop of nearly 0.65 volts across its two terminals. When diode 852 enters a reverse breakdown region transistors 140 and 150 turn on, and, subsequently, structure 800 is triggered into a snap-back mode thereby to form a low impedance current discharge path between terminals A and K, as discussed above.

Advantageously, during the time period when diode 852 enters a reverse breakdown region, because of the presence of resistor 858 in branch 890, diode 860 does not enter a reverse breakdown region and, as such, no current flows through branch 890, preventing transistor 130 from being turned on.

When a negative voltage/current pulse is applied across terminals A and K, diode 862 enters a reverse breakdown region while diode 860 is forward-biased, forcing transistors 130 and 140 to turn on to thereby trigger structure 800 into a snap-back mode to discharge the current. Consequently, circuit 850 ensures that during an ESD pulse, a current flows either in branch 880—in order to trigger a snap-back between transistors 140 and 150—or in branch 890—in order to trigger a snap-back between transistors 140 and 130—but not both.

The trigger voltage of ESD protection structure 800 is, therefore, approximately equal to the reverse breakdown voltage of the zener diodes which is much smaller than the reverse break-down voltage of junction 126 of FIG. 5.

The exemplary embodiments of the invention described above are illustrative and not limitative. Other embodiments of this invention are obvious to those skilled in the art and are intended to fall within the scope of the appended claims.

We claim:

1. An electrostatic discharge (ESD) protection structure comprising:

corner cells, each corner cell comprising a first semiconductor region having a square-shape and being of a first conductivity type; said first semiconductor region being surrounded on two sides by a second semiconductor region of a second conductivity type, said first and said second semiconductor regions both formed in a second square-shaped semiconductor region of the first semiconductor conductivity type, said second square-shaped semiconductor region formed in a third square-shaped semiconductor region of the second conductivity type, said corner cells to form all corners of said ESD structure;

edge cells, each edge cell comprising a first semiconductor region having a square-shape and being of the first conductivity type; said first semiconductor region being surrounded on three sides by a second semiconductor region of the second conductivity type, said first and said second semiconductor regions both formed in a second square-shaped semiconductor region of the first semiconductor conductivity type, said second square-shaped semiconductor region formed in a third square-shaped semiconductor region of the second semiconductor conductivity type, said edge cells to form all edges of said ESD structure; and center cells, each center cell comprising a first semiconductor region having a square-shaped semiconductor region and being of the first conductivity type; said first semiconductor region being surrounded on four sides by a second semiconductor region of the second conductivity type, said first and said second semiconductor regions both formed in a second square-shaped semiconductor region of the first conductivity type, said second square-shaped semiconductor region formed in a third square-shaped semiconductor region of the second conductivity type, said center cells to form all portions of said ESD structure which are not formed by said corner cells and said edge cells.

2. The ESD protection structure of claim 1 wherein said corner cells, said edge cells and said center cells have square geometrical shapes with identical areas.

3. The ESD protection structure of claim 2 wherein said ESD protection structure has a square geometry.

* * * * *